United States Patent
Hong

(10) Patent No.: US 10,110,232 B2
(45) Date of Patent: Oct. 23, 2018

(54) MULTIPLEXER AND LATCH SYSTEM

(71) Applicant: TAIWAN SEMICONDUCTOR MANUFACTURING COMPANY, LTD., Hsinchu (TW)

(72) Inventor: Hyunsung Hong, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 81 days.

(21) Appl. No.: 14/755,999

(22) Filed: Jun. 30, 2015

(65) Prior Publication Data

US 2017/0005660 A1   Jan. 5, 2017

(51) Int. Cl.
H03K 3/356 (2006.01)
H03K 19/0185 (2006.01)
H03K 17/693 (2006.01)

(52) U.S. Cl.
CPC ..... H03K 19/01855 (2013.01); H03K 17/693 (2013.01)

(58) Field of Classification Search
CPC ....... H03K 19/17736; H03K 19/17756; H03K 19/17764; H03K 19/1731; H03K 19/177
See application file for complete search history.

(56) References Cited

U.S. PATENT DOCUMENTS

| | | |
|---|---|---|
| 5,812,881 A | 9/1998 | Ku et al. |
| 5,877,636 A | 3/1999 | Truong et al. |
| 6,141,775 A * | 10/2000 | Lee ............ G06F 11/3013 714/30 |
| 7,579,895 B2 | 8/2009 | Sun et al. |
| 8,405,442 B2 | 5/2013 | Chen |
| 8,436,671 B2 | 5/2013 | Chern et al. |
| 8,610,488 B2 | 12/2013 | Yu et al. |
| 8,625,240 B2 | 1/2014 | Chung et al. |
| 8,847,659 B1 | 9/2014 | Lan et al. |
| 2006/0132209 A1* | 6/2006 | Meltzer ............ H03K 3/356139 327/202 |
| 2010/0259308 A1 | 10/2010 | Wang et al. |
| 2012/0242388 A1 | 9/2012 | Su et al. |

(Continued)

FOREIGN PATENT DOCUMENTS

| KR | 1998-032101 | 7/1998 |
|---|---|---|
| KR | 19980032101 | 3/2000 |

(Continued)

OTHER PUBLICATIONS

Office Action dated Dec. 20, 2016 from corresponding application No. TW 104136037.

(Continued)

*Primary Examiner* — Sibin Chen
(74) *Attorney, Agent, or Firm* — Hauptman Ham, LLP

(57) ABSTRACT

A memory includes a clock generator and a multiplexing latch circuit. The clock generator is configured to generate a first latching clock signal and a second latching clock signal based on a multiplexing select signal and a clock signal, and to transmit the first latching clock signal and the second latching clock signal. The multiplexing latch circuit is configured to select the first data or the second data based on the first latching clock signal and the second latching clock signal, and to store and output the selected data.

20 Claims, 8 Drawing Sheets

(56) References Cited

U.S. PATENT DOCUMENTS

| | | | |
|---|---|---|---|
| 2014/0002153 A1* | 1/2014 | Yang | H03L 7/0802 |
| | | | 327/158 |
| 2014/0210526 A1* | 7/2014 | Masleid | H04L 7/005 |
| | | | 327/152 |
| 2014/0266386 A1 | 9/2014 | Huang et al. | |
| 2014/0328115 A1* | 11/2014 | Bartling | H03K 3/35625 |
| | | | 365/156 |
| 2016/0241219 A1* | 8/2016 | Kim | G01R 31/3177 |

FOREIGN PATENT DOCUMENTS

| | | |
|---|---|---|
| TW | 201417280 | 5/2014 |
| TW | 201417286 | 5/2014 |
| TW | 201519363 | 5/2015 |

OTHER PUBLICATIONS

Office Action dated Sep. 9, 2016 and English translation from corresponding application No. KR 10-2015-0165750.
Notice of Allowance dated Feb. 22, 2017 and English translation from corresponding application No. KR 10-2015-0165750.

\* cited by examiner

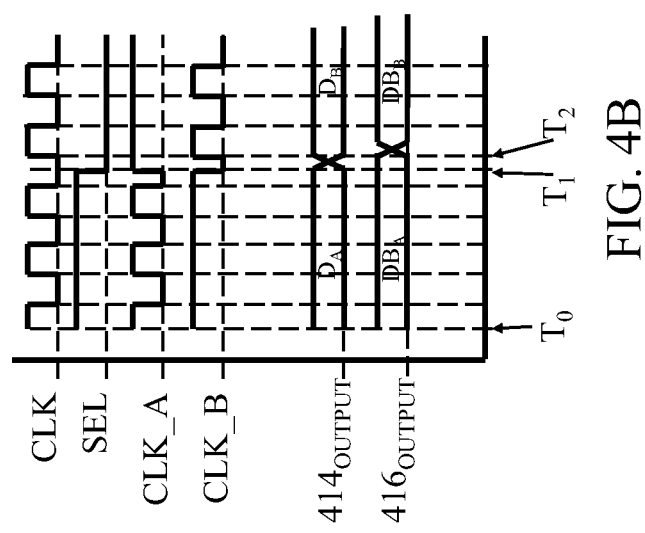

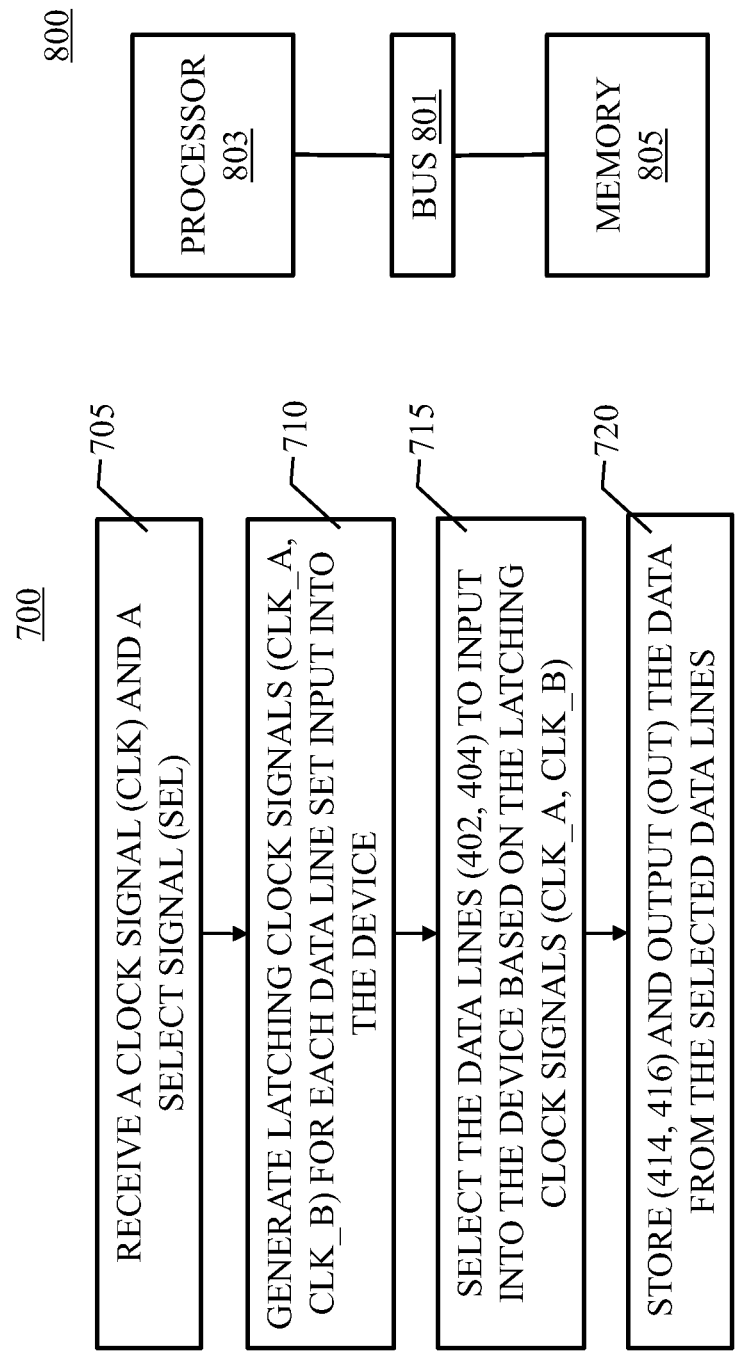

MULTIPLEXER AND LATCH SYSTEM

BACKGROUND

In an integrated circuit, there are many individual devices such as one or more of a memory, an analog-to-digital converter, a processor, and other similar devices. The individual devices may be unable to be tested during or after manufacture. At small process nodes (e.g., 22 nm), the individual devices sometimes are not tested via wafer probes because, in some applications, such probes usable at these small process nodes are too fragile. As such, in some applications, wafer level testing of the individual devices is less favorable and on-chip testing is preferred. To perform on-chip testing, the individual devices of the integrated circuit may include a multiplexer and a latch to select a data source to perform different operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4B is a timing diagram of the operation of the multiplexing latch circuit, in accordance with some embodiments.

FIG. 7 is a flowchart of a method of multiplexing and latching data using latching clock signals, in accordance with some embodiments.

FIG. 8 is a functional block diagram of a computer or processor-based system upon which or by which an embodiment is implemented.

DETAILED DESCRIPTION

Figure 1:
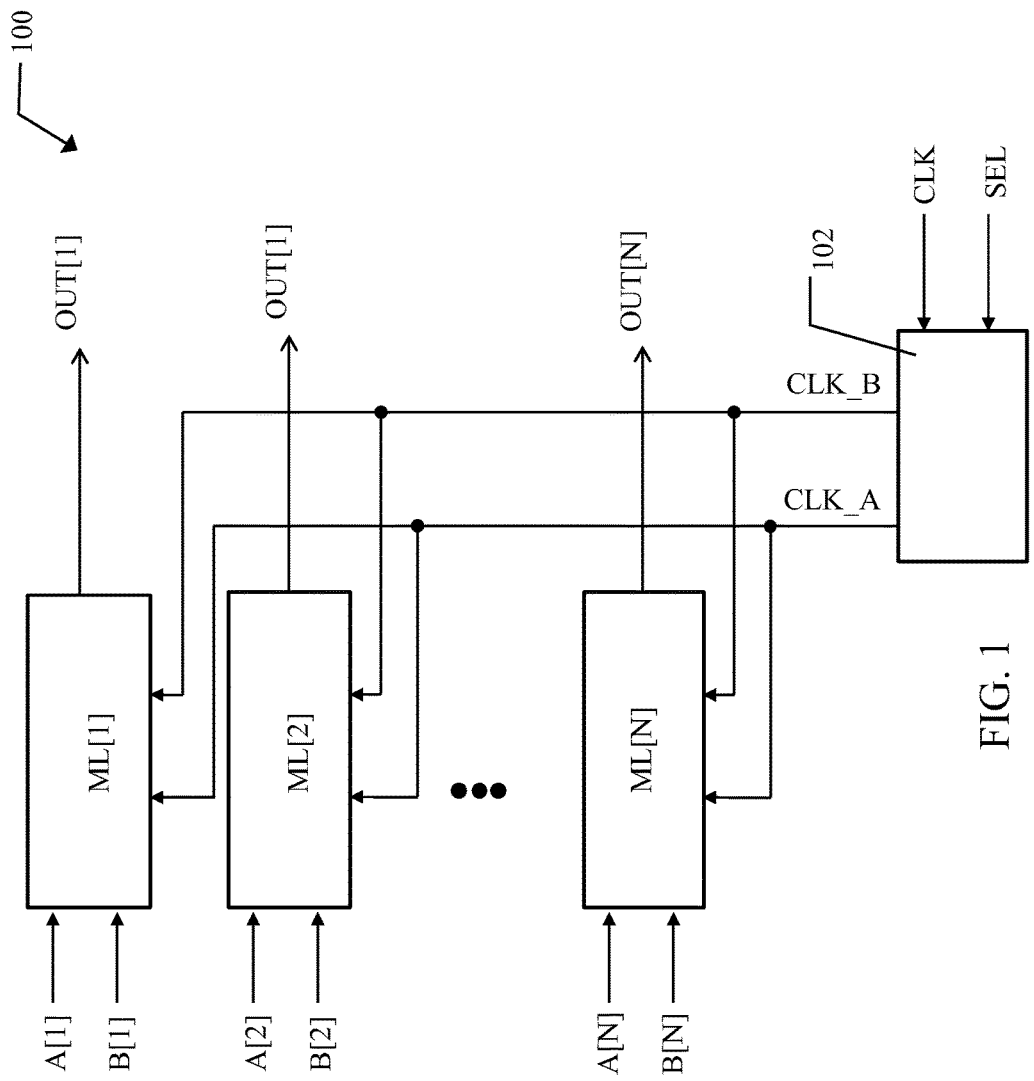
FIG. 1 is a block diagram of an interface circuit, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An interface circuit according to one or more embodiments includes a clock generator configured to generate latching clock signals and a multiplexing latch circuit configured to select and latch data based on the latching clock signals. The multiplexing latch circuit has fewer transistors than a separate multiplexer and latch. Further, the multiplexing latch circuit reduces the number of switching delays and increases speed of the interface circuit. The reduced number of transistors also reduces the space occupied by the interface circuit in an integrated circuit.

FIG. 1 is a block diagram of an interface circuit 100, in accordance with some embodiments. Interface circuit 100 receives data from data line set A having N data lines and data line set B also having N data lines, N is a positive integer greater than two. Data line sets A and B are configured to carry different sources of data such as a data bus for a normal mode and a test bus for a test mode. In some embodiments, interface circuit 100 includes more than two data line sets. In some embodiments, interface circuit 100 is implemented in a memory circuit for testing the memory circuit. In other embodiments, interface circuit 100 is implemented into a device in an integrated circuit that is configured to receive data from a source for testing that device.

Interface circuit 100 includes a clock generator 102 configured to receive a clock signal on a clock line CLK and a select signal on a select line SEL. Based on the clock signal and the select signal, clock generator 102 generates and outputs a latching clock signal $S_A$ for data line set A on line CLK_A and a latching clock signal $S_B$ for data line set B on line CLK_B. If data line A is selected, the latching clock signal $S_A$ carries a clock signal, which alternates between two logic values every cycle of the clock signal, and the latching clock signal $S_B$ carries a predetermined logic value. If data line B is selected, the latching clock signal $S_B$ carries a clock signal and the latching clock signal $S_A$ carries the predetermined logic value. However, because interface circuit 100 is configured to select one of the data sets, a single latching clock signal carries the clock signal. In some embodiments, clock generator 102 is configured to generate more than two latching clock signals.

Data line set A includes N data lines A[1] to A[N] and data line set B includes N data lines B[1] to B[N]. Output data lines OUT include N output data lines OUT[1] to OUT[N]. Interface circuit 100 includes N multiplexing latches ML[1] to ML[N] (collectively referred to as "multiplexing latches ML"). A multiplexing latch ML[n], n being an index that ranges from 1 to N, is coupled to a data line A[n] of data line set A, a data line B[n] of data line set B, and an output data line OUT[n]. The multiplexing latches ML are also configured to receive the latching clock signals $S_A$ and $S_B$.

Based on the latching clock signals $S_A$ and $S_B$, the multiplexing latches ML select to receive data from data line set A or data line set B, store the data from the selected data line set, and output the data from the selected data line set on the output data line OUT. For example, interface circuit 100 selects the data from data line set A in the multiplexing latches ML, stores the data from data line set A, and outputs the data on the output lines OUT. In some embodiments, interface circuit 100 outputs the data into a memory array to perform a read or write operation.

Figure 2:
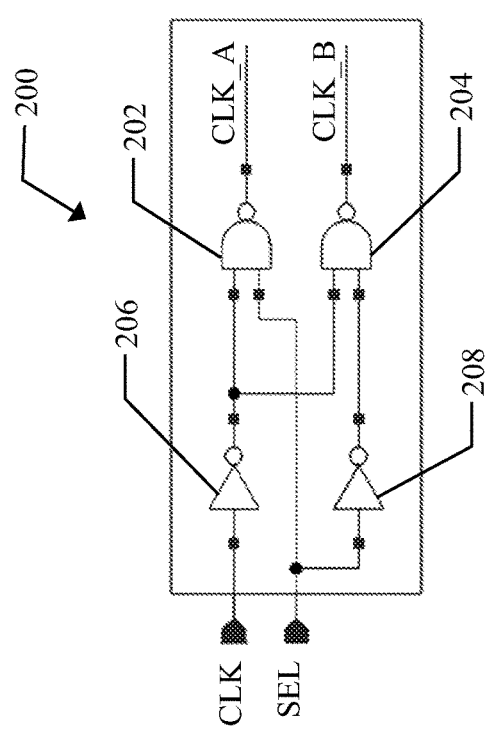
FIG. 2 is a circuit diagram of a clock generator for generating latching clock signals in an integrated circuit of FIG. 1, in accordance with some embodiments.

FIG. 2 is a circuit diagram a clock generator 200, usable as the clock generator 102 of FIG. 1, for generating the latching signals $S_A$ $S_B$, in accordance with some embodiments. The clock generator includes a first NAND gate 202, a second NAND gate 204, and inverters 206 and 208. A clock line CLK is coupled to an input terminal of inverter 206. The output terminal of inverter 206 is coupled to a first input terminal of NAND gate 202 and a first input terminal of NAND gate 204. A second input terminal of NAND gate 202 is coupled to a select line SEL. The select line SEL is also coupled to an input terminal of inverter 208 and the output terminal of inverter 208 is coupled to a second input terminal of NAND gate 204. The output terminal of NAND gate 202 is coupled to line CLK_A and the output terminal of NAND gate 204 is coupled to line CLK_B.

Clock generator 200 generates and outputs latching clock signal $S_A$ for selecting data line set A on line CLK_A and latching clock signal $S_B$ for selecting data line set B on line CLK_B. The select signal on select line SEL is a logic high value (i.e., a high potential voltage $V_{DD}$) when data line set A is selected, and the select signal on select line SEL is a logic low value (i.e., a low potential voltage $V_{SS}$) when data line set B is selected.

In the event that data line set A is selected (i.e., the select signal on select line SEL is a logic high value), inverter 208 receives the logic high value, inverts the logic high value into a logic low value, and outputs the logic low value into NAND gate 204, thereby forcing NAND gate 204 to output and maintain a latching clock signal $S_B$ as a logic high value on line CLK_B. In addition, the clock signal on line CLK is inverted by inverter 206 and is input into NAND gate 202 with the select signal on select line SEL (i.e., a logic high value). Using the inverted clock signal and the select signal, NAND gate 202 generates and outputs a latching clock signal $S_A$ as a clock signal on line CLK_A.

In the event that data line set B is selected (i.e., the select signal on select line SEL is a logic low value), the select signal on line SEL causes NAND gate 202 to output and maintain latching clock signal $S_A$ as a logic high value on line CLK_A. If data line B is selected, the clock signal on line CLK is inverted by inverter 206 and is input into NAND gate 204 with the inverted select signal (i.e., a logic high value). In this manner, NAND gate 204 outputs a latching clock signal $S_B$ as a clock signal on line CLK_B.

If data line set A is selected, the latching clock signal $S_A$ is a clock signal and the latching clock signal $S_B$ is a predetermined logic value. If data line set B is selected, the latching clock signal $S_B$ is a clock signal and the latching clock signal $S_A$ is the predetermined logic value. The clock signal oscillates between an upper half-cycle (i.e., a logic high value) and a lower half-cycle (i.e., a logic low value). The predetermined logic value corresponds to a logic high value. In some embodiments, the predetermined logic value is a voltage associated with a logic low value. In some embodiments, the clock signal is another type of continuous wave signal (e.g., a sine wave, a sawtooth wave, a triangle wave, etc.). In some embodiments, clock generator 200 is configured to output more than two latching clock signals and clock generator 200 is configured to receive additional select signals such that one latching clock signal carries the clock signal and the remaining latching clock signals carry the predetermined logic value.

Figure 3:
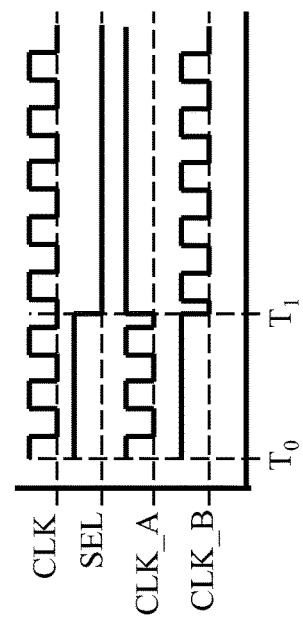
FIG. 3 is a timing diagram of a clock generator of FIG. 2 in an integrated circuit of FIG. 1, in accordance with some embodiments.

FIG. 3 is a timing diagram of an embodiment of the clock generator, such as clock generator 200 of FIG. 2, in an integrated circuit, in accordance with some embodiments. For the purpose of clarity, the timing diagrams disclosed herein are simplified and do not show any delays that occur due to switching. If data line set A is selected at time $T_0$, the select signal on line SEL is a logic high value. Accordingly, the latching clock signal $S_A$ on line CLK_A carries a clock signal that alternates between an upper half-cycle and a lower half-cycle and the latching clock signal $S_B$ on line CLK_B carries the predetermined logic value. When data line set B becomes selected at time $T_1$, the select signal on line SEL is a logic low value. Accordingly, the latching clock signal $S_B$ on line CLK_B carries a clock signal that alternates between an upper half-cycle and a lower half-cycle and the latching clock signal $S_A$ on line CLK_A carries the predetermined logic value.

Figure 4A:
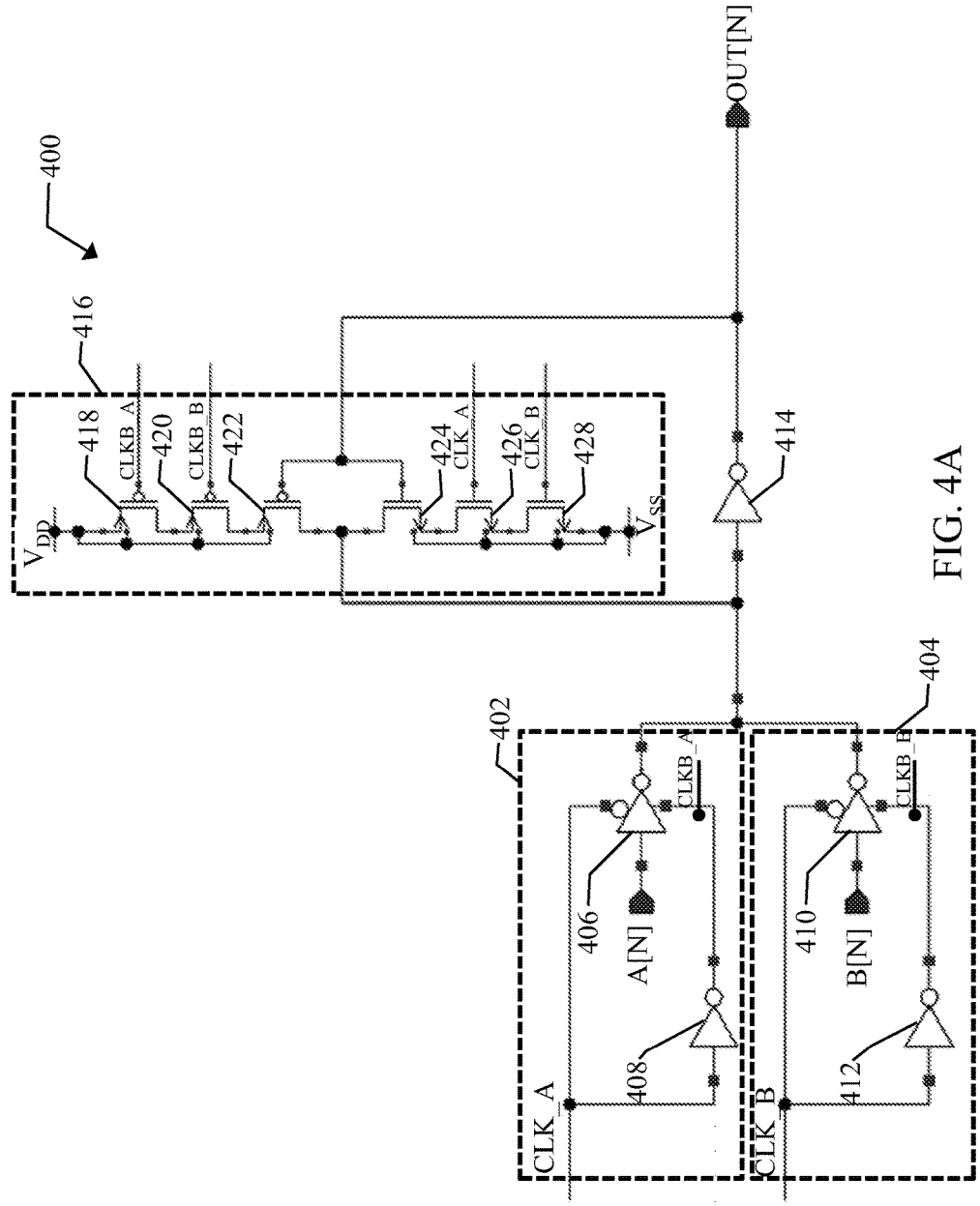
FIG. 4A is a circuit diagram of a multiplexing latch for selecting and latching data using latching clock signals in an integrated circuit of FIG. 1

FIG. 4A is a circuit diagram of a multiplexing latch 400 for selecting and latching data using latching clock signals $S_A$ and $S_B$ from the clock generator 200 of FIG. 2, in accordance with some embodiments. The circuit diagram of FIG. 4A includes labeled lines that are electrically connected with other lines having the identical label for clarity. Multiplexing latch 400 is usable as one of multiplexing latches ML of FIG. 1. Multiplexing latch 400 includes a selecting circuit 402 and a selecting circuit 404, which are configured to select the data to latch based on the latching clock signals $S_A$ and $S_B$. The multiplexing latch 400 further includes an inverter 414 and tristate inverter 416. The inverter 414 is cross-coupled with a tristate inverter 416 to form a latch circuit. Inverter 414 is coupled to the output terminals of the selecting circuits 402 and 404.

Selecting circuit 402 includes a tristate inverter 406 and an inverter 408. Tristate inverter 406 has an input terminal coupled to a data line A[n] of data line set A. The line CLK_A is coupled to a low enable terminal of tristate inverter 406 and an input terminal of inverter 408. An output terminal of inverter 408 is coupled to a high enable terminal of tristate inverter 406. The output terminal of inverter 408 is also coupled to tristate inverter 416 via line CLKB_A. The output terminal of tristate inverter 406 is coupled to the output terminal of selecting circuit 402.

Selecting circuit 404 is the same as selecting circuit 402 except tristate inverter 410 has an input terminal coupled to a data line B[n] of data line set B, the line CLK_B is coupled to a low enable terminal of tristate inverter 410 and an input terminal of inverter 412, and an output terminal of inverter 412 is coupled to a high enable terminal of tristate inverter 410. The output terminal of inverter 412 is also coupled to tristate inverter 416 via line CLKB_B. The output terminal of tristate inverter 410 is coupled to the output terminal of selecting circuit 404.

The input terminal of inverter 414 is coupled to the output terminals of selecting circuits 402 and 404. The output terminal of inverter 414 is coupled to an input terminal of tristate inverter 416 and an output terminal of tristate inverter 416 is also coupled to an input terminal of inverter 414. The output terminal of inverter 414 is connected with the output terminal of multiplexing latch 400.

Tristate inverter 416 comprises a PMOS transistor 418 having a source terminal coupled to a high potential voltage source $V_{DD}$, a gate terminal coupled to the output terminal of inverter 608 via line CLKB_A, and a drain terminal coupled to a source terminal of a PMOS transistor 420. PMOS transistor 420 also includes a gate terminal coupled to the output terminal of inverter 612 via line CLKB_B and a drain terminal coupled to a source terminal of a PMOS transistor 422. PMOS transistor 422 also includes a gate terminal coupled to the output terminal of inverter 414 and a drain terminal coupled to the input terminal of inverter 414.

Tristate inverter 416 also comprises an NMOS transistor 424 with a drain terminal coupled to the input terminal of inverter 414, a gate terminal coupled to the output terminal of inverter 414, and a source terminal coupled to a drain terminal of an NMOS transistor 426. NMOS transistor 426 also includes a gate terminal coupled to line CLK_A and a source terminal coupled to a drain terminal of an NMOS transistor 428. NMOS transistor 428 also includes a gate terminal coupled to line CLK_B and a source terminal coupled to a low potential voltage source $V_{SS}$.

Tristate inverter 416 includes two low enable terminals formed by PMOS transistors 418 and 420. If either PMOS transistor 418 or PMOS transistor 420 is turned off when the input into tristate inverter 416 is a logic low value, PMOS transistor 422 does not receive and output the high voltage potential $V_{DD}$. However, when both PMOS transistors 418 and 420 are turned on and PMOS transistor 422 receives a logic low value from the output terminal of tristate inverter 414, PMOS transistors 418-422 couple the high voltage potential $V_{DD}$ to the output terminal of tristate inverter 416 (i.e., the drain of PMOS transistor 422), thereby outputting a logic high value.

Tristate inverter 416 also includes two high enable terminals formed by NMOS transistors 426 and 428. If either NMOS transistor 426 or NMOS transistor 428 is turned off, NMOS transistor 424 does not receive and output the low voltage potential $V_{SS}$ when the input into tristate inverter 416 is a logic high value. When both NMOS transistors 426 and 428 are turned on and NMOS transistor 424 receives a logic high value from the output terminal of inverter 414, NMOS transistors 424-428 couple the low voltage potential $V_{SS}$ to the output terminal of tristate inverter 416 (i.e., the drain of NMOS transistor 424), thereby outputting a logic low value.

For the purpose of describing the operation of multiplexing latch 400, the input data on the selected data line A[n] of data line set A is referred to as data $D_A$ and the input data on the selected data line data line B[n] of data line set B is referred to as data $D_B$. When data $D_A$ and data $D_B$ are in inverted form within multiplexing latch 400, data $D_A$ and data $D_B$ are referred to as data $DB_A$ and data $DB_B$. Further, other signals within multiplexing latch 400 may be inverted as described below to carry a complementary signal.

FIG. 4B is a timing diagram of waveforms at various nodes of multiplexing latch 400 of FIG. 4A and clock generator 200 of FIG. 2, in accordance with some embodiments.

In operation, when data line set A is selected at time $T_0$, the latching clock signal $S_A$ is a clock signal that is input into the low enable terminal of tristate inverter 406. Inverter 408 also receives the latching clock signal $S_A$ on line CLK_A, inverts the latching clock signal on line CLK_A signal, and outputs the inverted latching clock signal $SB_A$ to the high enable terminal of tristate inverter 406 via line CLKB_A.

The output terminal of tristate inverter 406 is configured to be enabled according to the signals at the high enable terminal and the low enable terminal. When the low enable terminal of tristate inverter 406 receives a logic low value and the high enable terminal of tristate inverter 406 receives a logic high value, tristate inverter 406 is enabled to invert a logic value at an input terminal of the tristate inverter 406 to an inverted logic value at the output terminal of tristate inverter 406. When the low enable terminal of tristate inverter 406 receives a logic high value and the high enable terminal of tristate inverter 406 receives a logic low value, tristate inverter 406 is disabled and has a high-impedance state at the output terminal of tristate inverter 406.

Thus, when the latching clock signal $S_A$ is in the lower half-cycle and inverted latching clock signal $SB_A$ is in the upper half-cycle, the low enable terminal of tristate inverter 406 receives a logic low value and the high enable terminal receives a logic high value, thereby enabling tristate inverter 406 to receive data $D_A$, invert data $D_A$ into data $DB_A$, and output data $DB_A$. On the other hand, when the latching clock signal $S_A$ is the clock signal in the upper half-cycle and inverted latching clock signal $SB_A$ is in the lower half-cycle, the low enable terminal of tristate inverter 406 receives a logic high value and the high enable terminal receives a logic low value, thereby disabling the output terminal of tristate inverter 406.

Further, when data line set A is selected to input the data (i.e., the select signal indicates that data line set A is selected), the latching clock signal $S_B$ on line CLK_B is the logic high value. In this event, selecting circuit 404 is configured to be disabled. Specifically, the logic high value is input into the low enable input of tristate inverter 410. Further, inverter 412 receives latching clock signal $S_B$ carrying the high logic value, inverts the high logic value into a low logic value, and outputs an inverted clock signal $SB_B$ carrying the logic low value into the high enable terminal, thereby causing the tristate inverter 410 to be disabled and have a high-impedance state at an output terminal. Thus, the latching clock signal $S_B$ carrying the predetermined logic value on line CLK_B disables selecting circuit 404.

Also, when data line set A is selected at time $T_0$, the latching clock signal $S_B$ carrying logic high value turns on NMOS transistor 428 and the inverted latching clock signal $SB_B$ carrying the logic low value turns on PMOS transistor 420. Also at time $T_0$, the upper half-cycle of latching clock signal $S_A$ will turn on NMOS transistor 426 and the lower half-cycle of inverted latching clock signal $SB_A$ will turn on PMOS transistor 418. However, the lower half-cycle of latching clock signal $S_A$ will turn off NMOS transistor 426 and the upper half-cycle of latching clock signal $SB_A$ turn off PMOS transistor 418. Thus, at time $T_0$, the tristate inverter 416 is enabled to receive data $D_A$ and output data $DB_A$.

Selecting circuit 402 and 404 operate in a similar manner when data line set B is selected. Specifically, at time $T_1$, the select signal on the select line SEL is set to a logic low value to select data line set B, the latching clock signal $S_A$ is a logic high value, thereby disabling selecting circuit 402. Also at time $T_1$, the latching clock signal $S_B$ carries the clock signal. Thus, during the lower half-cycle of the latching clock signal $S_B$, selecting circuit 404 is configured to receive data $D_B$, invert data $D_B$ into data $DB_B$, and output data $DB_B$. During the upper half-cycle of the latching clock signal $S_B$ on line CLK_B, selecting circuit 404 is disabled.

At time $T_1$, the input terminal of inverter 414 receives the data $DB_B$ from selecting circuit 404, inverts the data $DB_B$ into data $D_B$, and outputs data $D_B$ from multiplexing latch 400 on line OUT. The output terminal of inverter 414 also outputs the data $D_B$ into the input terminal of tristate inverter 416.

When data line set B is selected at time $T_1$, selecting circuit 404 transmits the data $DB_B$ to the inverter 414. At time $T_1$, the latching clock signal $S_A$ carrying the logic high value on line CLK_A turns on NMOS transistor 426 and the inverted latching clock signal $SB_A$ carrying the logic low value on line CLKB_A will turn on PMOS transistor 418. However, at time $T_1$, the latching clock signal $S_B$ on line CLK_B is in the lower half-cycle and the inverted latching clock signal $SB_B$ is in the upper half-cycle, thereby turning off PMOS transistor 420 and NMOS transistor 428 and disabling the tristate inverter 416. At time $T_2$, the upper half-cycle of the latching clock signal $S_B$ on line CLK_B will turn on NMOS transistor 428 and the lower half-cycle of the inverted latching clock signal $SB_B$ on line CLKB_B will turn on PMOS transistor 420, thereby causing tristate inverter 416 to output data $DB_B$.

Inverter 414 and tristate inverter 416 are cross-coupled and form a feedback loop to latch the data $D_A$ or data $D_B$ in multiplexing latch 400. Tristate inverter 416 is configured to be operational during the upper half-cycle of either of the latching clock signal $S_A$ on line CLK_A or the latching clock signal $S_B$ on line CLK_B. Thus, inverter 414 receives data $DB_A$ from selecting circuit 402 or data $DB_B$ from selecting circuit 404 during the lower half-cycle of the latching clock signals $S_A$ and $S_B$ and outputs the data $D_A$ or data $D_B$. During the upper half-cycle of the latching clock signals $S_A$ and $S_B$, PMOS transistor 422 or NMOS transistor 424 is configured to turn on to output data $DB_A$ or data $DB_B$ into the input terminal of inverter 414. If the data $D_A$ or data $D_B$ corresponds to a logic high value, NMOS transistor 424 turns on to output the low voltage $V_{SS}$ (i.e., a logic low value) and, if the data D corresponds to a logic high value, PMOS transistor 422 turns on to output the high voltage $V_{DD}$ (i.e., a logic high value).

Multiplexing latch 400 is referred to as a half-latch because the latching operation triggers on a rising edge of the clock signal. In other embodiments, a rising edge and a falling edge of the clock signal are used for triggering the latching operation. In some embodiments, the devices of multiplexing latch 400 are substituted with any other suitable configuration. For example, in another embodiment, a NAND logic gate is implemented to generate a single clock signal based on the latching clock signals $S_A$ and $S_B$.

Figure 5A:
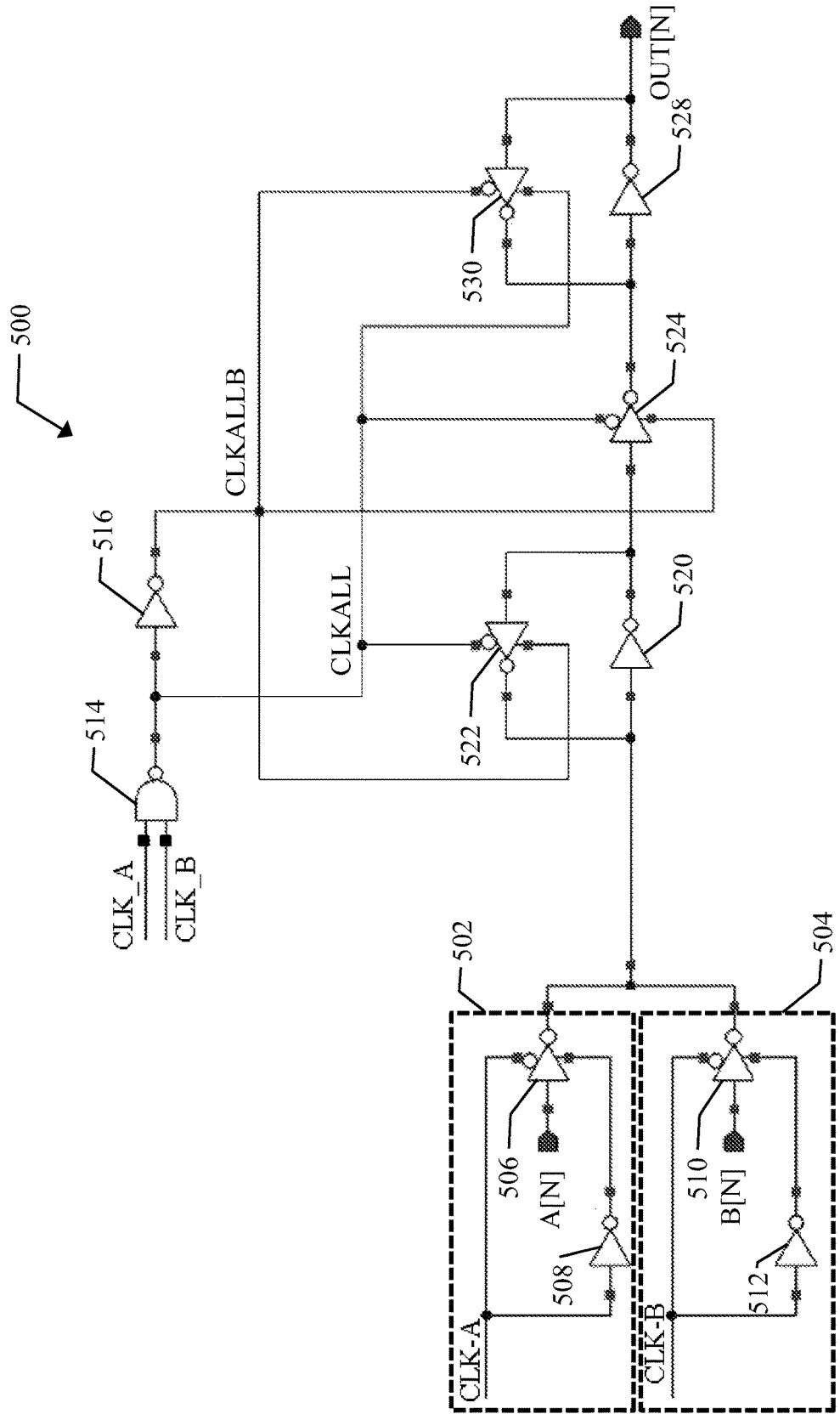
FIG. 5A is a circuit diagram of another multiplexing latch for selecting and latching data using latching clock signals in an integrated circuit of FIG. 1

FIG. 5A is a circuit diagram of a multiplexing latch 500, which is similar in operation to the multiplexing latch 400 in FIG. 4A, for selecting and latching data using latching clock signals $S_A$ and $S_B$ in an integrated circuit, according to some embodiments. Multiplexing latch 500 receives the latching clock signals $S_A$ and $S_B$, selects a data line of the data line set based on the latching clock signals $S_A$ and $S_B$, stores the data from the selected data line, and outputs the data from the selected data line set. The detailed operation of multiplexing latch 500 is similar to multiplexing latch 400 and is thus omitted.

Multiplexing latch 500 includes a selecting circuit 502 and a selecting circuit 504. Selecting circuit 502 is the same as selecting circuit 402 except that the output terminal of inverter 508 is uncoupled from line CLKB_A and with reference numerals increased by 100. Selecting circuit 504 is the same as selecting circuit 404 except that the output terminal of inverter 512 is uncoupled from line CLKB_B and with reference numerals increased by 100.

Multiplexing latch 500 includes a NAND gate 514 having a first input terminal coupled to line CLK_A, a second input terminal coupled to line CLK_B, and an output terminal coupled to line CLKALL. The output terminal of NAND gate 514 is coupled to an input terminal of an inverter 516 and an output terminal of inverter 516 is coupled to line CLKALLB.

The output terminals of selecting circuits 502 and 504 are coupled to an input terminal of an inverter 520. Inverter 520 is cross-coupled with a tristate inverter 522, thereby forming a first latch. Tristate inverter 522 has a high enable terminal coupled to line CLKALLB and a low enable terminal coupled to line CLKALL.

The output terminal of inverter 520 is coupled to an input terminal of a tristate inverter 524. Tristate inverter 524 has a high enable terminal is coupled to line CLKALLB and a low enable terminal coupled to line CLKALL. The output terminal of inverter 524 is coupled to an input terminal of an inverter 528 that is cross-coupled with a tristate inverter 530. Inverter 528 and tristate inverter 530 form a second latch. Tristate inverter 530 has a high enable terminal coupled to line CLKALL and a low enable terminal coupled to line CLKALLB. The output terminal of inverter 528 is connected with the output terminal of multiplexing latch 500.

Figure 5B:
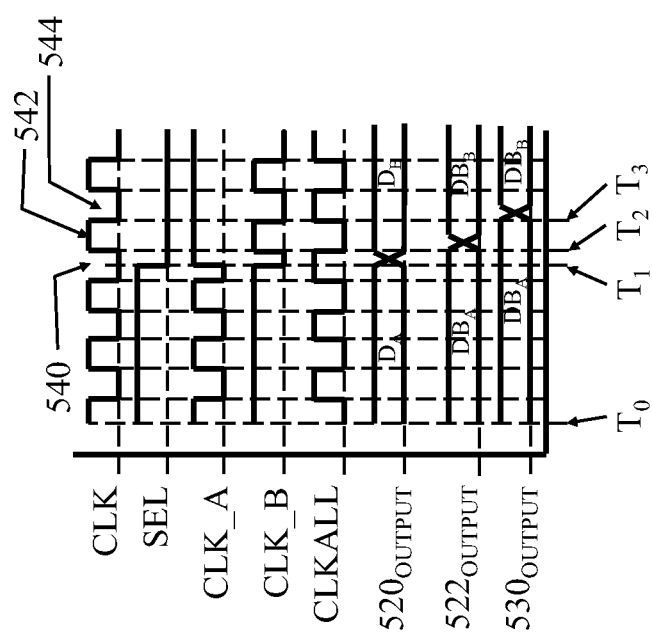
FIG. 5B is a timing diagram of the operation of the multiplexing latch circuit, in accordance with some embodiments.

FIG. 5B is a timing diagram of waveforms at various nodes of multiplexing latch 500 of FIG. 5A and clock generator 200 of FIG. 2, in accordance with some embodiments.

During the operation of multiplexing latch 500, NAND gate 514 is configured to receive the latching clock signals $S_A$ and $S_B$, perform a logical NAND operation on the latching clock signals $S_A$ and $S_B$ to generate a clock signal $S_{CLOCK}$, and output the clock signal $S_{CLOCK}$ on line CLKALL. Inverter 516 receives the clock signal $S_{CLOCK}$ on line CLKALL, inverts the generated clock signal on line CLKALL, and outputs the inverted clock signal $SB_{CLOCK}$ on line CLKALLB.

At time $T_0$, selecting circuit 502 is enabled during the lower half-cycle of the latching clock signal $S_A$ on the line CLK_A, thereby causing inverter 506 to invert data $D_A$ and output data $DB_A$ to inverter 520. Selecting circuit 502 is disabled during the upper half-cycle of the latching clock signal $S_A$. At time $T_0$, inverter 520 is configured to receive the data $DB_A$ from selecting circuit 502, invert the data $DB_A$ into data $D_A$, and output the data $D_A$ to tristate inverter 522 and tristate inverter 524.

At time $T_1$, selecting circuit 504 is enabled during the upper half-cycle of the latching clock signal $S_B$, thereby causing inverter 510 to invert data $D_B$ and output data $DB_B$ to inverter 520. Selecting circuit 504 is disabled during the upper half-cycle of the latching clock signal $S_B$ on the line CLK_B. At time $T_1$, the inverter 520 receives the data $DB_B$ from the selecting circuit 504, inverts the data $DB_B$ into data $D_B$, and outputs the data $D_B$ to tristate inverter 522 and tristate inverter 524. Thus, inverter 520 receives and outputs data $D_B$ during a first half-cycle 540.

At time $T_1$, the low enable terminal of tristate inverter 522 receives the upper half-cycle of the clock signal $S_{CLOCK}$ on line CLKALL and the high enable terminal of tristate inverter 522 receives the lower half-cycle of the clock signal $SB_{CLOCK}$ on line CLKALLB, thereby disabling tristate inverter 522. Tristate inverter 524 will be disabled during every CLKALL upper half-cycle (high state).

At time $T_2$, the low enable terminal of tristate inverter 522 receives the lower half-cycle of the clock signal $S_{CLOCK}$ on line CLKALL and the high enable terminal of tristate inverter 522 receives the upper half-cycle of the clock signal $SB_{CLOCK}$, thereby enabling tristate inverter 522. Thus, at time $T_2$, tristate inverter 522 receives data $D_B$, inverts data $D_B$ into data $DB_B$, and outputs data $DB_B$ during a second half-cycle 542. Tristate inverter will also be enabled at time $T_2$ to receive data $D_B$ from inverter 520, invert the data $D_B$ into data $DB_B$, and transmit the data $DB_B$ to the second latch formed by inverter 528 and tristate inverter 530. Tristate inverter 524 is configured to buffer the second latch and the first latch. The high enable terminal of tristate inverter 530 receives the lower half-cycle of the clock signal $S_{CLOCK}$ and the low enable terminal of tristate inverter 530 receives the upper half-cycle of the clock signal $SB_{CLOCK}$, thereby disabling tristate inverter 530.

At time $T_3$, the high enable terminal of tristate inverter 530 receives the upper half-cycle of the clock signal $S_{CLOCK}$ and the low enable terminal of tristate inverter 530 receives the lower half-cycle of the clock signal $SB_{CLOCK}$, thereby enabling tristate inverter 530. At time $T_3$, tristate inverter 530 receives data $D_B$, inverts data $D_B$ into data $DB_B$, and outputs data $DB_B$ during a third half-cycle 544.

Multiplexing circuit 500 is referred to as a full-latch because a falling edge of the clock signal and a rising edge of the clock signal are used for triggering the latching operation to fully store the data $D_A$ or data $D_B$ therein. In some embodiments, multiplexing circuit 500 receives the clock signal on line CLK in addition to receiving the latching clock signals. In such alternative embodiment, NAND gate 514 and the operation to generate clock signals on lines CLKALL and CLKALLB are omitted.

Figure 6:
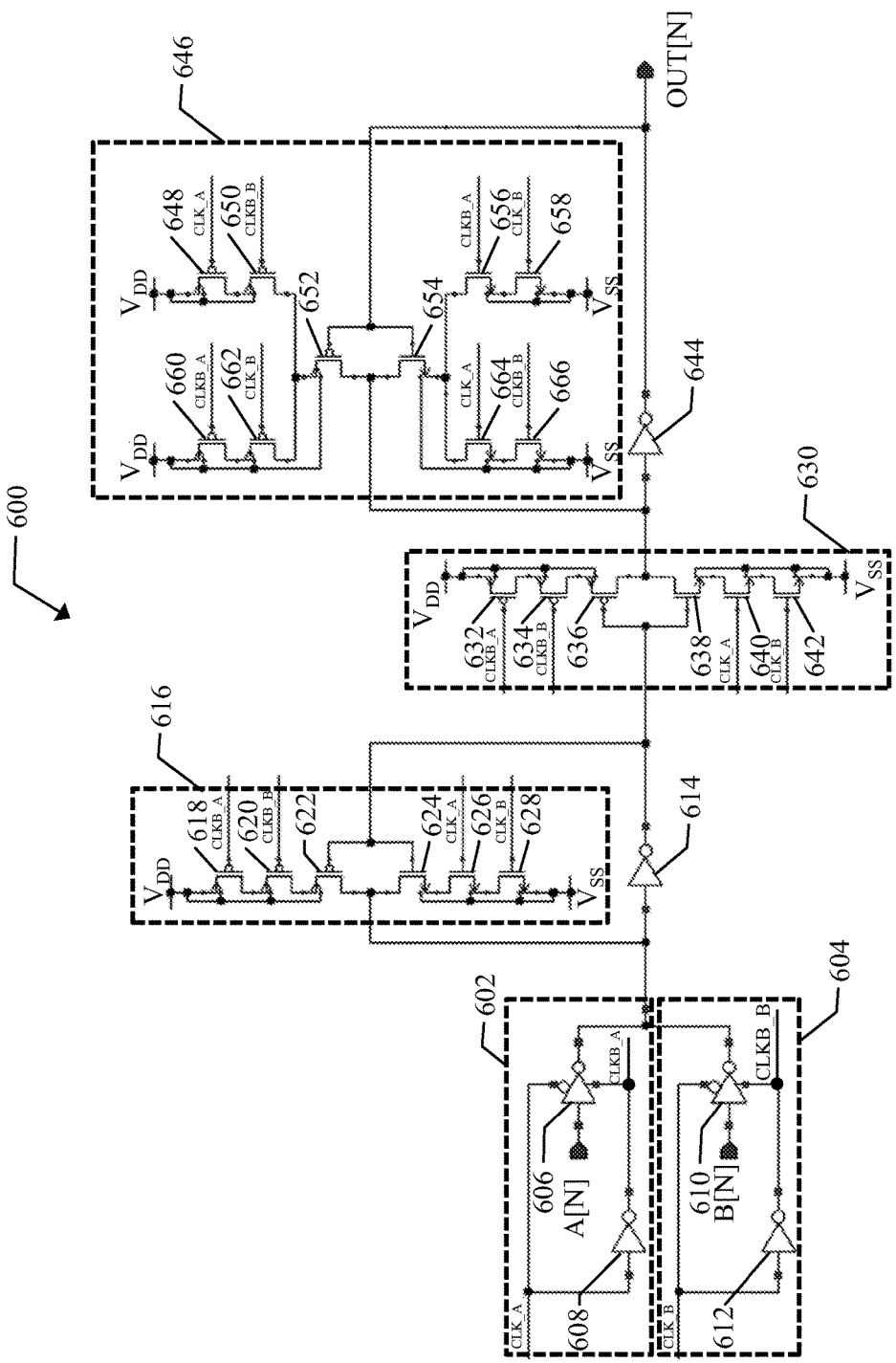
FIG. 6 is a circuit diagram of another multiplexing latch for selecting and latching data using latching clock signals in an integrated circuit of FIG. 1, in accordance with some embodiments.

FIG. 6 is a circuit diagram of another multiplexing latch 600 for selecting and latching data using latching clock signals in an integrated circuit, in accordance with some embodiments. Multiplexing latch 600 is similar to multiplexing latch 400 except including tristate inverter 630, inverter 644, and tristate inverter 646, with the output terminal of inverter 644 being coupled to the output terminal of the multiplexing latch 600, and with reference numerals increased by 200.

Multiplexing latch 600 includes a selecting circuit 602 and a selecting circuit 604. Selecting circuit 602 is the same as selecting circuit 402 except that the output terminal of inverter 608 is also coupled to tristate inverters 630 and 646 via line CLKB_A and with reference numerals increased by 200. Selecting circuit 604 is the same as selecting circuit 404 except that the output terminal of inverter 612 is also coupled to tristate inverters 630 and 646 via line CLKB_B and with reference numerals increased by 200. Multiplexing latch 600 includes a cross coupled latch formed by inverter 614 and tristate inverter 616 that is the same as the cross coupled latch formed by inverter 414 and tristate inverter 416 with reference numerals increased by 200, and with the exception that the output of the inverter 614 is not connected with the output terminal of the multiplexing latch.

The output terminal of inverter 614 and the input terminal of tristate inverter 616 are further coupled to the input terminal of a tristate inverter 630. Tristate inverter 630 is the same as tristate inverter 616 except having a different output and with reference numerals increased by fourteen.

The output terminal of tristate inverter 630 is coupled to an input terminal of an inverter 644. Inverter 644 is cross-coupled with a tristate inverter 646 to form a second latch circuit. The output terminal of inverter 644 is coupled to an input terminal of tristate inverter 646 and an output terminal of tristate inverter 646 is coupled to an input terminal of inverter 644. The output terminal of inverter 644 is also connected to the output line OUT to output data from multiplexing latch 600.

Tristate inverter 646 comprises a PMOS transistor 648 having a source terminal coupled to a high potential voltage source $V_{DD}$, a gate terminal coupled to line CLK_A, and a drain terminal coupled to a source terminal of a PMOS transistor 650. PMOS transistor 650 also includes a gate terminal coupled to line CLKB_B and a drain terminal coupled to a source terminal of a PMOS transistor 652. PMOS transistor 652 includes a drain terminal coupled to the output terminal of inverter 646 and a gate terminal coupled to the input terminal of inverter 646. Tristate inverter 646 also comprises an NMOS transistor 654 with a drain terminal coupled to the input terminal of inverter 646, a gate terminal coupled to the output terminal of inverter 646, and a source terminal coupled to a drain terminal of an NMOS transistor 656. NMOS transistor 656 also includes a source terminal coupled to line CLKB_A and a source terminal coupled to a drain terminal of an NMOS transistor 658. NMOS transistor 658 also includes a gate terminal coupled to line CLK_B and a drain terminal coupled to a low potential voltage source (e.g., ground, $V_{SS}$, etc.).

Tristate inverter 646 also comprises a PMOS transistor 660 having a source terminal coupled to a high potential voltage source $V_{DD}$, a gate terminal coupled to line CLKB_A, and a drain terminal coupled to a source terminal of a PMOS transistor 662. PMOS transistor 662 also includes a gate terminal coupled to line CLK_B and a drain terminal coupled to the source terminal of PMOS transistor 652.

Tristate inverter 646 also comprises an NMOS transistor 664 having a source terminal coupled to the source terminal of NMOS transistors 654, a gate terminal coupled to line CLK_A, and drain a terminal coupled to a source terminal of an NMOS transistor 666. NMOS transistor 666 also includes a gate terminal coupled to line CLKB_B and a source terminal coupled to a low potential voltage source (e.g., $V_{SS}$, ground, etc.).

Selecting circuit 602 is enabled during the lower half-cycle of the latching clock signal $S_A$, thereby causing inverter 606 to invert data $D_A$ into data $DB_A$ and output data $DB_A$ to inverter 614. Selecting circuit 602 is disabled during the upper half-cycle of the latching clock signal $S_A$ on the line CLK_A is in the upper half-cycle. Similarly, selecting circuit 604 is enabled during the lower half-cycle of the latching clock signal $S_B$, thereby causing inverter 610 to invert data $D_B$ and output data $DB_B$. Selecting circuit 604 is disabled during the upper half-cycle of the latching clock signal $S_B$.

Inverter 614 and tristate inverter 616 are configured as a first latch to receive the data, store the data, and output the data to tristate inverter 630. Tristate inverter 630 is configured as a buffer for a second latch that is implemented by inverter 644 and tristate inverter 646. Specifically, tristate inverter 630 receives the data D and outputs the data to inverter 644 during the upper half-cycle. Inverter 644 receives the data, stores the data, and outputs the data.

Tristate inverter 646 is configured to be enabled during the upper and lower half-cycle of the latching clock signal $S_A$ and $S_B$. Specifically, PMOS transistors 660 and 662 and NMOS transistors 664 and 666 enable tristate inverter 646 during the upper half-cycle of the latching clock signal $S_A$ on CLK_A. PMOS transistors 648 and 650 and NMOS transistors 656 and 658 enable inverter 646 during the upper half-cycle of the latching clock signal $S_B$ on CLK_B. PMOS transistors 660 and 662 and NMOS transistors 664 and 666 enable tristate inverter 646 during the lower half-cycle of the latching clock signal $S_B$ on CLK_B. PMOS transistors 648 and 650 and NMOS transistors 656 and 658 enable inverter 646 during the lower half-cycle of the latching clock signal $S_A$ on CLK_A.

Tristate inverter 646 is a full latch configured to latch the data during both the upper and lower half-cycles of the clock signal. Multiplexing latch 600 is configured to latch the data faster than a typical full latch, because the multiplexing latch 600, compared to the typical full latch, lacks an additional multiplexer stage and therefore the delay time in the additional multiplexer stage of the typical full latch is saved.

FIG. 7 is a flowchart of a method 700 for multiplexing and latching data in an integrated circuit using latching clock signals, in accordance with one or more embodiments. In some embodiments, method 700 is applicable to the circuits illustrated in conjunction with FIG. 2, FIG. 4A, FIG. 5A, and/or FIG. 6.

The method begins with operation 705, where clock generator 200 receives a clock signal on line CLK and a select signal on line SEL. The select signal on line SEL indicates a data line set to select for input into a device of the integrated circuit. In some embodiments, the device is a memory array, an analog-to-digital converter (ADC), or a processor. The method proceeds to operation 710, where clock generator 200 generates latching clock signal $S_A$ on line CLK_A and generates latching clock signal $S_B$ on line CLK_B. Each data line set is a different data source for the device. After generating the latching clock signals $S_A$ and $S_B$, the method proceeds to operation 715, where multiplexing latch ML[n] selects data line A[n] or B[n] based on the latching clock signals $S_A$ and $S_B$. The method proceeds to operation 720, where multiplexing latch ML[n] stores and outputs the data on lines OUT[n] from the selected data line set. The method stores the data from the selected data line set until new data is provided from the selected data line set or until a different data line set is selected to be input into the device.

FIG. 8 is a functional block diagram of a processor-based system 800 upon which or by which an embodiment is implemented.

In some embodiments, the processor-based system is implemented as a single "system on a chip." Processor-based system 800 includes a communication device such as a bus 801 for transferring information and/or instructions among the components of processor-based system 800 and a memory 805 for storing data. Processor 803 is connected to bus 801 to obtain instructions for execution and process information stored in, for example, memory 805. In some embodiments, processor 803 is also accompanied by one or more specialized components to perform certain processing functions and tasks such as one or more digital signal processors (DSP), one or more ADCs, one or more digital-to-analog converters (DAC), or one or more application-specific integrated circuits (ASIC). A device within the processor-based system 800, such as memory 805 or other components, includes multiplexing latches ML[n] to receive input data from at least two data sources and selectively output the received data in response to various selection signals from processor 803 or other suitable control circuits. In some embodiments, the multiplexing latches ML[n] enable the processor-based system 800 to perform on-chip testing of the device.

In one embodiment, a memory includes a clock generator and a multiplexing latch circuit. The clock generator is to generate a first latching clock signal and a second latching clock signal in response to a select signal and a clock signal. The multiplexing latch circuit is configured to select first data on a first data line or second data on a second data line based on the first latching clock signal and the second latching clock signal, and to store and output the selected data.

In another embodiment, the description describes a method of selecting data in a memory. The method includes generating a first latching clock signal for selectively latching a first data line set and a second latching clock signal for selectively latching a second data line set based on a select signal and a clock signal. The method further includes selecting to store the first data line set or the second data line set in a latch based on the first latching clock signal and the second latching clock signal. The method stores the data from the selected data line in a first latch and outputs the data to perform a memory operation based on the selected data.

In another embodiment, a memory includes a clock generator and a multiplexing latch circuit. The clock generator is configured to generate a first latching clock signal and a second latching clock signal responsive to a multiplexing select signal and a clock signal. The multiplexing latch is configured to select a first data on a first data line or a second data on a second data line based on the first latching clock signal and the second latching clock signal, to store and output the selected data based on the first latching clock signal and the second latching clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a clock generator configured to generate a first latching clock signal and a second latching clock signal in response to a select signal and a clock signal, wherein the clock generator is configured to generate each of the first latching clock signal and the second latching clock signal having a frequency of the clock signal; and
a multiplexing latch circuit configured to select either first data on a first data line or second data on a second data line based on the first latching clock signal and the second latching clock signal, and to store and output the selected data.

2. The integrated circuit of claim 1, wherein when the first data is selected to be stored in the multiplexing latch circuit, the clock generator is configured to set the first latching signal to oscillate between two logic values and to set the second latching clock signal to a predetermined logic value.

3. The integrated circuit of claim 2, wherein the multiplexing latch circuit is configured to select the first data during a first half-cycle of the first latching clock signal and store the first data during a second half-cycle of the first latching clock signal responsive to the first data selected to be stored in the multiplexing latch circuit.

4. The integrated circuit of claim 1, wherein the multiplexing latch circuit comprises:
a first selecting circuit configured to select and output the first data based on the first latching clock signal; and
a second selecting circuit configured to select and output the second data based on the second latching clock signal.

5. The integrated circuit of claim 1, wherein the multiplexing latch circuit comprises a first latch, the first latch including:
an inverter configured to receive the selected data via an input terminal; and
a tristate inverter having an input terminal coupled to an output terminal of the inverter and an output terminal coupled to the input terminal of the inverter.

6. The integrated circuit of claim 5, wherein the tristate inverter comprises:
   a first switch configured to enable the tristate inverter based on the first latching clock signal; and
   a second switch configured to enable the tristate inverter based on the second latching clock signal.

7. The integrated circuit of claim 6, wherein, when the first data is selected to be stored in the first latch, the first switch is configured to disable the tristate inverter during a first half-cycle of the first latching clock signal, to enable the first switch during a second half-cycle of the first latching clock signal, and the second switch is configured to enable the tristate inverter during the first half-cycle of the first latching clock signal and the second half-cycle of the first latching clock signal.

8. The integrated circuit of claim 7, wherein the multiplexing latch circuit further comprises a buffer having an input terminal coupled to an output terminal of the inverter and an output terminal coupled to an input terminal of a second latch.

9. The integrated circuit of claim 8, wherein the buffer is configured to output the selected data to the second latch and the second latch is configured to store the selected data during a third half-cycle of the first latching clock signal responsive to the first data selected to be stored in the multiplexing latch circuit.

10. The integrated circuit of claim 9, wherein the first half-cycle of the clock signal is immediately followed by the second half-cycle of the clock signal, and the second half-cycle of the clock signal is immediately followed by the third half-cycle of the clock signal.

11. A method of selecting data in an integrated circuit, the method comprising:
   generating a first latching clock signal and a second latching clock signal based on a select signal and a clock signal, wherein each of generating the first latching clock signal and generating the second latching clock signal comprises generating a signal having a frequency of the clock signal;
   either electrically coupling a first data line set responsive to the first latching clock signal or electrically coupling a second data line set responsive to the second latching clock signal with a set of latching devices; and
   storing the data from the selected data line set in the set of latching devices.

12. The method of claim 11, wherein, when the data from the first data line set is selected to be stored in the set of latching devices, setting the first latching clock signal to alternate between two logic values and setting the second latching clock signal to a predetermined logic value.

13. The method of claim 12, further comprising, when the data from the first data line set is selected to be stored in the set of latching devices, outputting the data from the first data line set to the set of latching devices during a first half-cycle of the clock signal.

14. The method of claim 13, wherein the storing the selected data from the selected data line set in the set of latching devices comprises latching the data from the selected data line set during a second half-cycle of the clock signal.

15. The method of claim 14, further comprising receiving the first latching clock signal and the second latching clock signal and storing the data from the selected data line set during the second half-cycle of the clock signal.

16. The method of claim 15, further comprising storing the data from the selected data line set in a second set of latching devices during a third half-cycle of the clock signal.

17. The method of claim 16, further comprising storing the selected data in the second set of latching devices during the third half-cycle of the clock signal based on the first latching clock signal and the second latching clock signal.

18. The method of claim 17, wherein the first half-cycle of the clock signal is immediately followed by the second half-cycle of the clock signal, and the second half-cycle of the clock signal is immediately followed by the third half-cycle of the clock signal.

19. An integrated circuit, comprising:
   a clock generator configured to generate a first latching clock signal and a second latching clock signal responsive to a multiplexing select signal and a clock signal, wherein the clock generator is configured to generate each of the first latching clock signal and the second latching clock signal having a frequency of the clock signal; and
   a multiplexing latch circuit configured to select either a first data on a first data line or a second data on a second data line based on the first latching clock signal and the second latching clock signal, and to store and output the selected data based on the first latching clock signal and the second latching clock signal.

20. The integrated circuit of claim 19, wherein the clock generator is configured to set the first latching signal to oscillate between two logic values and to set the second latching clock signal to a predetermined logic value responsive to the first data selected to be stored in the multiplexing latch circuit.

* * * * *